United States Patent [19]

Jarvinen

[11] Patent Number: 5,406,635
[45] Date of Patent: Apr. 11, 1995

[54] NOISE ATTENUATION SYSTEM

[75] Inventor: Kari J. Jarvinen, Tampere, Finland

[73] Assignee: Nokia Mobile Phones, Ltd., Salo, Finland

[21] Appl. No.: 13,775

[22] Filed: Feb. 5, 1993

[30] Foreign Application Priority Data

Feb. 14, 1992 [FI]  Finland .................. 920649

[51] Int. Cl.$^6$ .......................................... H04B 15/00
[52] U.S. Cl. ..................... 381/94; 381/68.4; 381/47
[58] Field of Search ............ 381/37, 46, 47, 94, 381/71, 68.4

[56]  References Cited

U.S. PATENT DOCUMENTS

| 4,628,529 | 12/1986 | Borth et al. ............ 381/94 |
| 4,811,404 | 3/1989 | Vilmur et al. ............ 381/94 |
| 5,214,741 | 5/1993 | Akamine et al. ............ 381/47 |

FOREIGN PATENT DOCUMENTS

| 0459362 | 4/1991 | European Pat. Off. . |
| 920649 | 9/1992 | Finland . |
| WO91/03042 | 3/1991 | WIPO . |

OTHER PUBLICATIONS

IEEE Transactions on Acoustics, Speech and Signal Processing, vol. 28, No. 2, Apr. 1980, New York, pp. 137–145, "Speech Enhancement Using a Soft-Decision Noise Suppression Filter", McAulay et al.

IEEE International Symposium on Circuits and Systems, vol. 1, May 1, 1990, "Sub-Band Adaptive IIR Noise Cancellation" pp. 775–778, Lee et al.

Electronics and Communications in Japan, vol. 64, No. 9, Sep. 1981, N.Y., U.S.A. "Quality Improvement of Synthesized Speech in Noisy Speech Analysis-Synthesis Processing", pp. 21–30, Nagabuchi et al.

*Primary Examiner*—Curtis Kuntz
*Assistant Examiner*—Ping W. Lee
*Attorney, Agent, or Firm*—Perman & Green

[57]  ABSTRACT

The invention relates to a noise attenuation system for voice signals. The invention is based on noise signal measurement during the tonal periods of the voice. The line spectrum structure of the spectrum of the tonal sounds is utilized in the noise measurement. In this way it is possible to measure the noise of different frequency bands with the aid of narrow-band filters.

10 Claims, 5 Drawing Sheets

NOISE ATTENUATION SYSTEM

The invention relates to a noise attenuation system and a method of noise attenuation used in the attenuation system.

BACKGROUND OF THE INVENTION

In telecommunication systems the voice or tonal signal as received by the receiver often contains strong background noise. In some cases the signal is intelligible only with difficulty and the listening process requires disagreeably high concentration. The voice quality is reduced by interference caused by an actual quality decrease in the transmission channel, such as transmission errors and multipath propagation. Also often noise is caused, to some degree, by powerful digital voice compression.

Noise occurring in the telecommunication channel may be caused by poor channel quality and voice signal compression, but also by loud audible noise around the speaker at the transmitting end. For instance in a moving car the interaction of motor and tires generates strong background noise, which is heard along with the user's voice through a mobile telephone.

The background noise can be reduced on the transmitting side by using separate microphones to measure the interference signal and by subtracting its effect from the voice signal before the voice is transmitted to the information channel. However, it is difficult to measure the noise signal using separate microphones, because there are generally several noise sources, and their mutual effect varies continuously. Thus a method with several microphones was not able to provide any good results.

The method in accordance with this invention is based on a more common situation in which no noise estimate measured by a second microphone is available. An estimate of the background noise is made directly from the noisy voice signal. In a noise suppression system of this kind a substantial part is formed by means, which measure the magnitude of the background noise and which eliminate its effect from the voice signal.

In order to make the noise suppression more effective many presented noise suppression systems rely on splitting the voice signal into frequency components before the background noise is measured. Then a Fourier analysis is performed on the voice signal (EP-367803, U.S. Pat. No. 5,012,519), or it is split into spectral components by using a filter group comprising band-pass filters (U.S. Pat. No. 4,628,529; 4,630,304; 4,630,305; FI-80173). Spectral ranges separated in this way can be processed so that the noise contents of the total signal is decreased. This is made by attenuating those bands in which the noise proportion is large compared to the net signal, and then forming the total signal by assembling the processed subsignals. A method based on such bandpass filtering is described i.e. in the paper R. K. McAulay, M. L. Malpass, "Speech Enhancement Using a Soft-Decision Noise Suppression Filter", IEEE Trans. Acoust., Speech, Signal Processing, vol. ASSP-28, No. 2, April 1980.

Prior art is described below with reference to FIG. 1, which shows the block diagram of a prior art noise attenuation system based on band splitting.

FIG. 1 shows the block diagram of a prior art noise attenuation system based on band splitting. This system is based on splitting the voice signal into channels. Here the noisy signal 100 is supplied via a buffer 101 to a channel splitting filter group 102. The power of each channel is calculated in the channel power estimation block 103. The channel power can be estimated e.g. by full-wave rectification and a suitable subsequent low-pass filtering. The block 105, controlled by the voice activity monitoring block 104, performs the background noise estimation based on the channel power estimates during pauses in the speech. The signal of each channel is multiplied in the multiplication block 106 by a coefficient calculated in the gain calculation block 107 based on the channel power estimate and the noise power estimate, so that channels having a low signal to noise ratio and containing much background noise are attenuated before the channels are assembled in the filter group 108 to a total voice band signal 109. The background noise estimates of the channels are obtained by finding pauses in the voice signal, which is possible to perform e.g. by comparing the combined power value of the channels to a limit value, which is adaptively controlled (U.S. Pat. No. 4,628,529).

The background noise power estimation forms an essential part of the above mentioned noise attenuation systems. The background noise power must be estimated in order to obtain the attenuation required on different frequency bands. The attenuation coefficients can be calculated by a mathematical function based on the signal power and the noise power, or by finding discrete attenuation coefficients.

In previously presented systems the background noise estimation is made utilizing the speech pauses. These methods search pauses in the speech, during which the signal represents only background noise, and whereby it is possible to measure the background noise power. This can be made either as directly monitoring the speech activity, whereby it is first decided whether the signal contains voice or only background noise, the background noise quantity being measured during detected pauses, or indirectly by using the power estimate as the long interval minimum of the signal formed by voice and noise.

It is difficult to separate reliably from the voice such signal periods which contain only noise. It is particularly difficult to distinguish the background noise from toneless sounds which resemble noise. On the other hand, methods which estimate the background noise with the aid of speech pauses do not continuously monitor changes in the background noise under the voice signal, and therefore they are not able to react rapidly and they cannot eliminate rapidly changing noise.

In order to eliminate noise from the voice signal it has also been presented a so called comb filtering method (U.S. Pat. No. 4,852,169) based on the periodical nature of tonal sounds. The comb filtering method realizes a filter, which in the frequency plane is toothed at intervals of the basic frequency. The principle in its use is to pass spectral peaks, which are located at intervals of the basic frequency and contain the information contents of a tonal sound, and to block the propagation of frequency components between the tooths which contain only noise.

The difficulty in the use of a comb filter is that the basic frequency of the voice signal must be known in order to realize it. It is a difficult task to measure the basic frequency, because it constantly changes during the speech. If the basic frequency is not estimated correctly or accurately, the comb filter will not function in a desired way. Thus with comb filters no particularly good results are obtained in order to separate the voice signal and the noise.

SUMMARY OF THE INVENTION

According to a first aspect of the present invention there is provided a noise attenuation system for attenuating noise in a signal, comprising a filter for dividing the signal into a plurality of channels of a predetermined bandwidth, means for calculating the signal strength in each channel and means for estimating the noise strength in each channel, characterized by a buffer, which enables the processing of the signal sequentially in distinct time periods of a predetermined length, coupled to a tonality decision block which classifies each period as tonal or toneless, a background noise measurement system which provides an estimate of the background noise strength depending on tonality to provide a signal to noise ratio for each channel in each time period, a gain calculation blocks for determining a gain coefficient for each channel in each time period, such that the channel attenuation may be increased for decreasing signal to noise ratio, coupled to a multiplication block for amplifying the channels dependent on the determined gain coefficient, and an assembly filter which reassembles the noise attenuated channels to produce a noise attenuated signal.

According to a second aspect of the present invention there is provided a method of attenuating noise in a signal comprising, dividing the signal into a plurality of channels of a predetermined bandwidth, processing the signal sequentially in distinct time periods of a predetermined length, making an estimate of the signal strength in each channel in each time period, classifying each period as tonal or toneless, making an estimate of the background noise strength depending on tonality to provide a signal to noise ratio for each channel in each time period, determining a gain coefficient for each channel in each time period, such that attenuation of the channel may be increase for decreasing signal to noise ratio, amplifying the channels dependent on the determined gain coefficient, and reassembling the noise attenuated channels to produce a noise attenuated signal.

An advantage of the present invention is the solution to the problems in the above described methods and the provision of a noise attenuation system, in which on one hand the voice signal's periodic nature is utilized but in which a, difficult to realize, reliable measurement of the basic frequency is not required. Also the background noise can be substantially eliminated from the voice signal in a reliable way so that the method is able efficiently to eliminate rapidly changing background noise.

A major part of the sounds used in different languages are by nature tonal, and because tonal sounds generally have a substantially longer duration than toneless sounds, a function reliably monitoring the background noise is obtained according to the invention.

BRIEF DESCRIPTION OF THE DRAWINGS

An embodiment of the invention is described in detail below, by way of example, with reference to the accompanying drawings, in which.

DETAILED DESCRIPTION OF THE INVENTION

Figure 1:
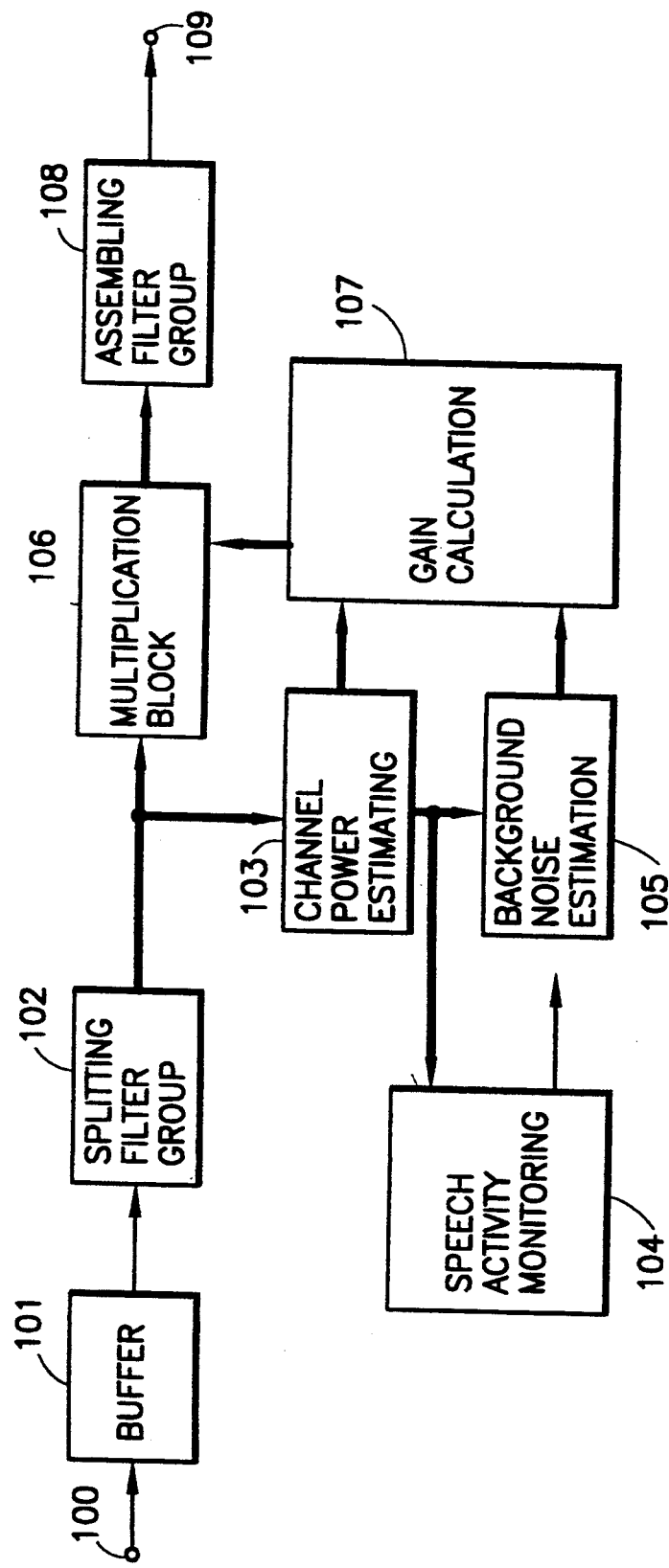
FIG. 1 is a block diagram of a prior art noise attenuation system based on band splitting.

FIG. 1 was described above. The solution according to the invention is described below with reference to the FIGS. 2 to 7 showing the realization according to the invention.

Figure 2:
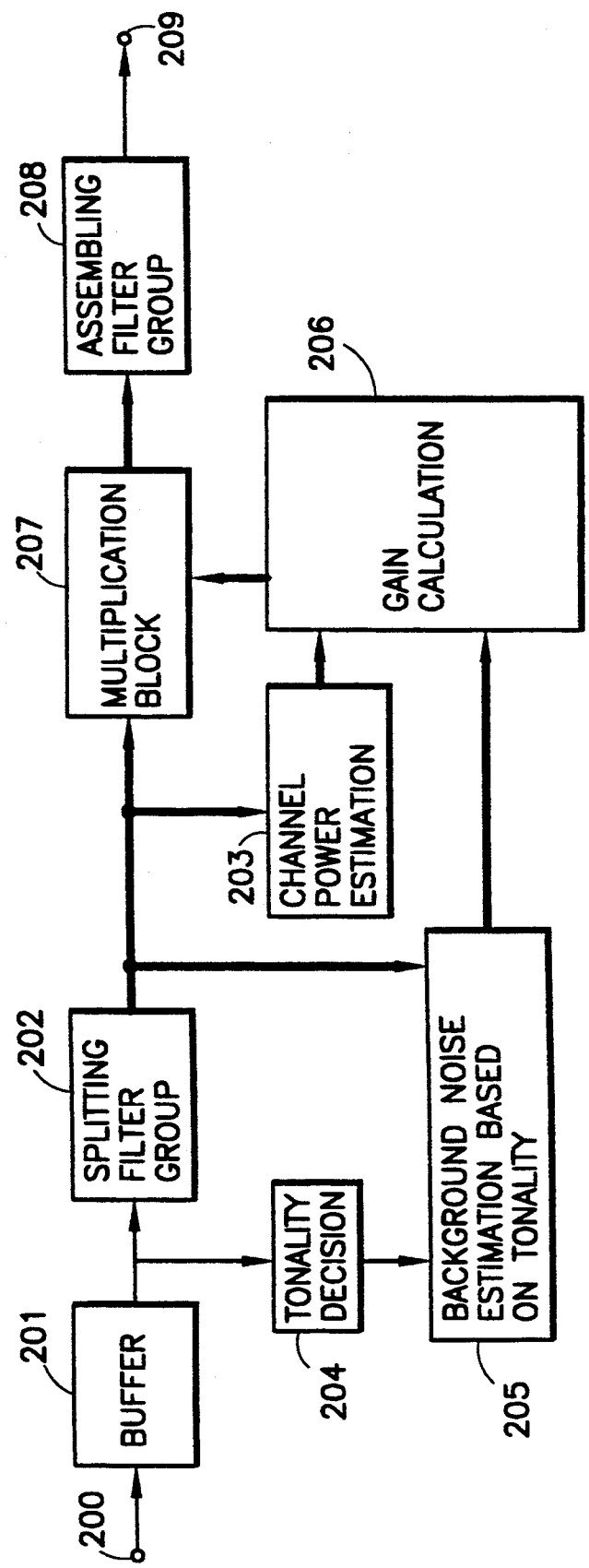
FIG. 2 is a basic block diagram of a noise attenuation system in accordance with the invention.

FIG. 2 shows the basic block diagram of the noise attenuation system in accordance with the invention. The noisy voice signal 200 to be processed is supplied via a buffer 201 to the filter group 202 splitting it into channels. Voice periods having the length of about 10 ms are processed at a time. The power of each channel is calculated in the estimation block 203. In accordance with the invention the power of the background noise is continuously monitored within the speech during its tonal portions. Information about whether the processed speech period contains a tonal voice signal is obtained from the tonality decision block 204. The background noise estimation block 205 based on the tonality provides an estimate of the background noise of the voice signal for all voice periods classified as tonal. The power estimate of the background noise and the channel power estimate calculated in the channel power calculation block are further supplied to the gain calculation block 206. With the aid of the background noise estimate and the channel power estimate obtained from the channel power estimation block a coefficient is calculated for each channel to attenuate the signal of the respective channel, the more the lower signal to noise ratio it has. The coefficient values for each channel are calculated so that the power of the voice signal is kept at the original value. The channel processing is carried out in the multiplication block 207. The filter group 208 assembles the total voice band signal 209, from which the background noise is eliminated in the process. The background noise estimation is described in more detail below.

Figure 3A:
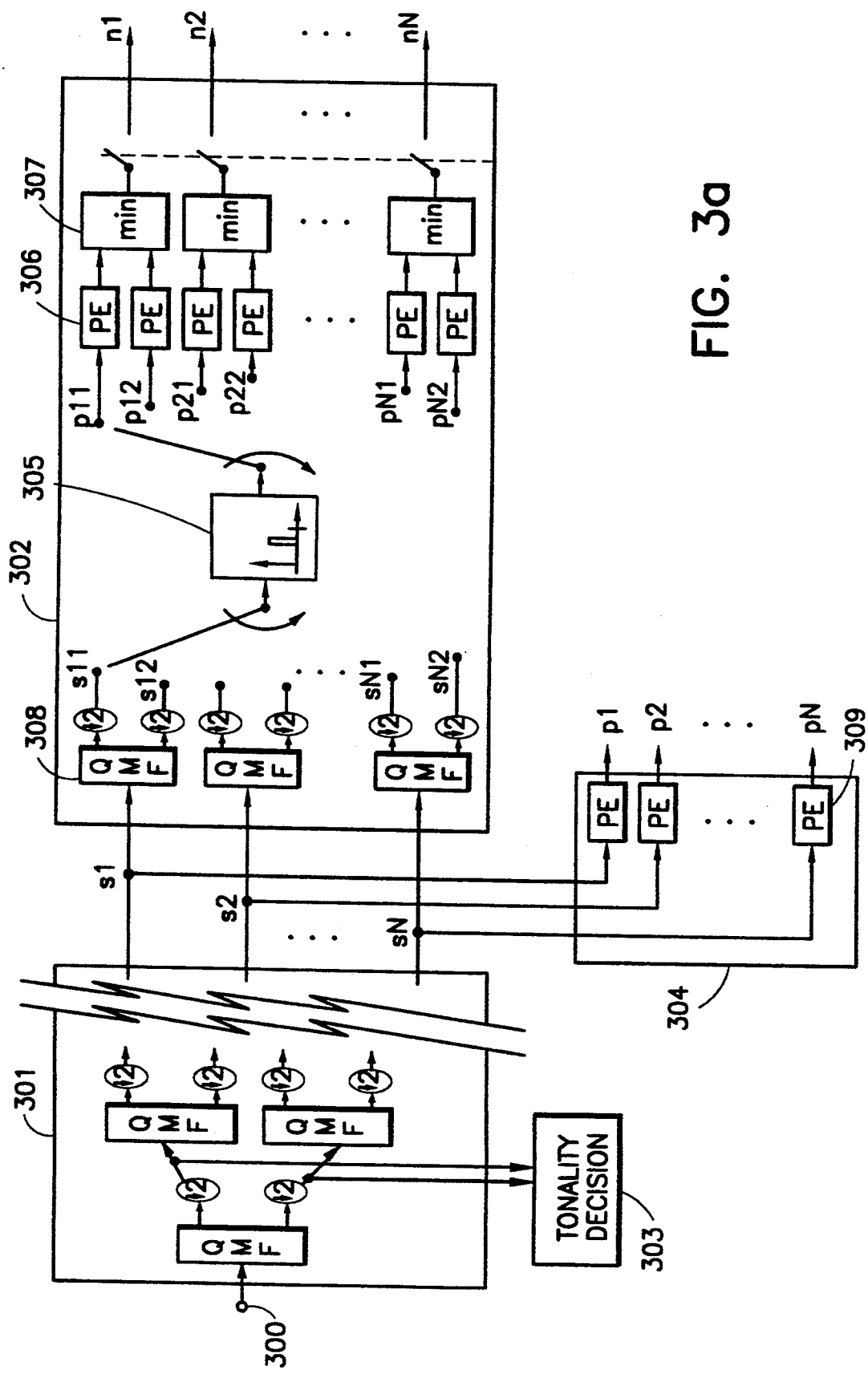
FIG. 3a is a detailed block diagram of the background noise measurement in the noise attenuation system of FIG. 2.

FIG. 3a shows a detailed block diagram of the background noise measurement in the noise attenuation system in accordance with the invention. In accordance with the invention the noisy voice signal 300 is divided into periods for the analysis. The signal processing is carried out in periods, for signal periods having a length of about 10 ms. 8 kHz is generally used as the sampling frequency. No buffer illustrating the periodical processing is depicted in the figure. The signal to be processed is supplied to a filter group 301 splitting it into N frequency bands.

In accordance with the invention the splitting filter group is realized as a tree structure of QMF filter blocks (Quadrature Mirror Filter), symmetrical in relation to the quarter of the sampling frequency. QMF-filters and their use is described e.g. in the paper D. Esteban, C. Galand, "Application of Quadrature Mirror Filters to Split-Band Voice Coding Schemes", Proceedings of 1977 International Conference on Acoustics, Speech and Signal Processing. The filter group required for the frequency splitting can be realized according to the figure by using a tree structure formed by QMF-filter blocks and by utilizing the reduction of the sampling frequency by 2.

In accordance with the method each voice signal period is classified either as tonal or toneless in the classification means 303. The tonal/toneless decision can be made according to the figure utilizing the internal tree structure of the filter group 301 based on the signals of voice band halves supplied by it. Then the classification is made by comparing with a suitably selected limit value, based on the fact whether the signal's power is centered below or above the middle (2 kHz at a sampling frequency of 8 kHz) of the processed band. Any other known method to make the tonal/toneless decision could be used just as well. The power of each channel is estimated in the PE-blocks 309 of the channel power estimation block 304. This can be realized in the earlier mentioned way utilizing full-wave rectification and low-pass filtering.

The background noise estimation based on tonality is made in the block 302. The filter used according to the invention in estimating the background noise is realized utilizing the filter structure required in the channel splitting by connecting to each channel a further QMF-filter, which once splits each band of the actual noise attenuation method into two partial bands for background noise estimation. These partial signals once split into partial bands are supplied to the noise eliminating filter 305 as a time multiplexed signal. The basic response of the noise eliminating filter 305 is shown in FIG. 4b. The basic response of the band-pass filter pairs covering the total voice band in this arrangement is shown in FIG. 4a.

In accordance with the invention the noise measurement is based on the formation of tonal sounds as a harmonic structure, a so called line spectrum of spectral peaks, which is characteristic of voice generation. The frequency response generated by the noise measurement filter 305 and the filter group 301, as well as the channel split filters 308 connected to it, is so designed that two narrow pass-bands are formed in the middle of each noise measurement band, the widths and mutual distance of the pass-bands being selected so that a spectral peak representing a tonal sound can only fall into one of them, and thus at least the contents of the other band represents background noise.

Figure 4A:
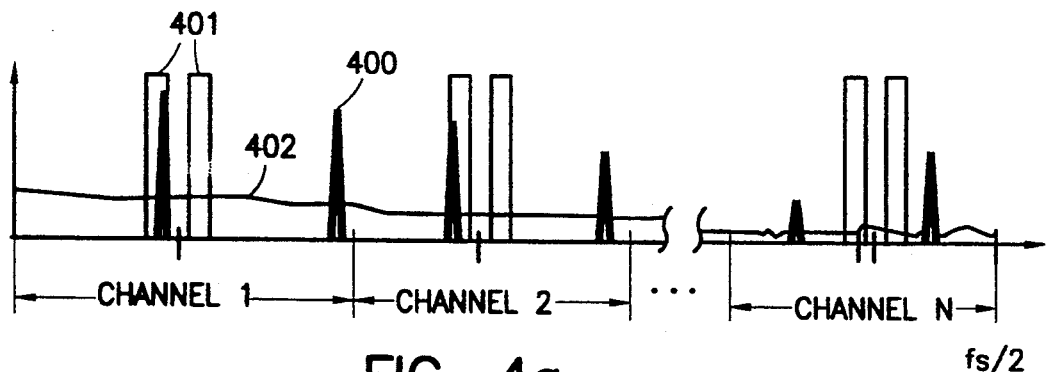
FIG. 4a is a basic illustration of the total response of the filter system used for the background noise estimation in a noise attenuation system in accordance with the invention.
Figure 4B:
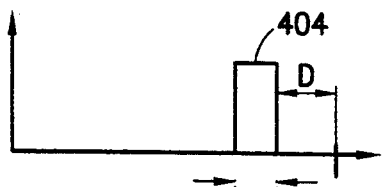
FIG. 4b is the amplitude response of an ideal noise estimation filter in a noise attenuation system in accordance with the invention.

The power of each signal passing the narrow pass-band formed according to FIG. 4a is measured in the PE power calculation blocks 306. For each filter group 301 channel a pair of pass-bands is formed by the filters 308 and 305, whereby the power of the signals passing this pair is measured and from these power values the lower is selected to represent for each channel the noise power of the respective channel. The power of the signals passing the noise estimation filter is compared in the min-block 307, which directs the narrow band power estimates representing the background noise for further processing. The switches at the output of the noise measurement block are activated when a tonal sound is processed. Otherwise the power values used in the previous frame are kept as background noise estimates. During the transition from a frame to another it is further possible to perform a low-pass equalization on the coefficient values of each channel with time constants selected according to a typical background noise. Thus the coefficient values are prevented from changing very abruptly, and thus a continuity is obtained in the attenuation of the channels, which increases the voice quality. The arrangement provides for the channels power estimates p1, p2, ..., pN, and the power of the background noise is represented by narrow band power estimates n1, n2, ..., nN. The actual power estimates of the channel noise are obtained from the narrow band power estimates by the coefficient $fs/(2 \times N \times BW)$, where BW is the bandwidth of the used pass-band, fs the sampling frequency of the voice signal, and N is the number of channels of the filter group 301.

Figure 3B:
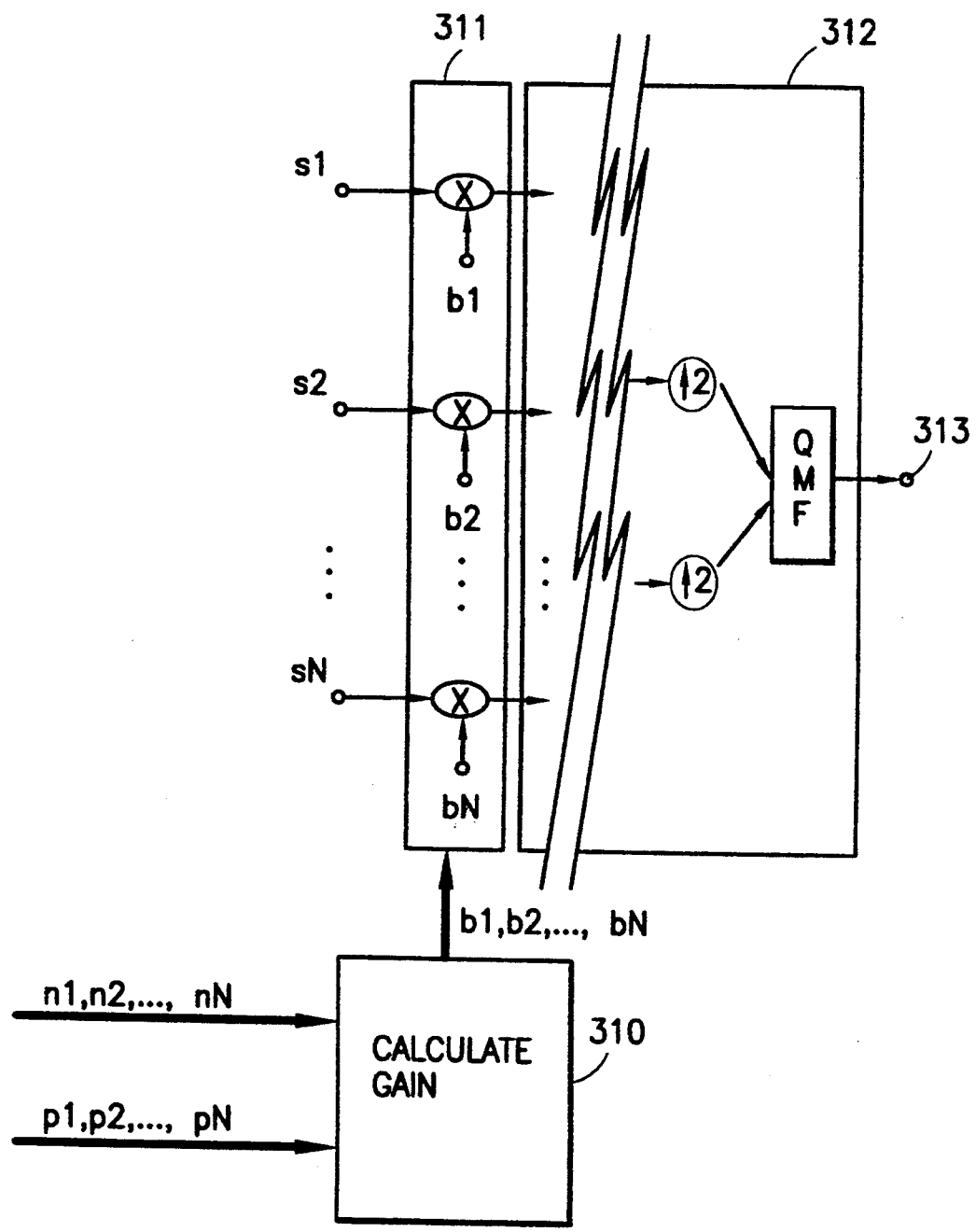
FIG. 3b is a detailed block diagram of channel processing and the forming of a noiseless voice signal in a noise attenuation system in accordance with the invention.

FIG. 3b shows a detailed block diagram of channel processing and the forming of a noiseless voice signal in the noise attenuation system according to the invention. The spectrum of the voice signal is processed according to the invention by attenuating those frequency bands, in which the noise signal power measured between the spectral lines is large compared to the signal power in the neighbourhood of the measurement point. Accordingly those frequency bands are amplified, in which the signal power is large compared to the noise signal level, so that the power of the voice signal cleared of noise has the same magnitude as the original voice signal covered by noise. The signal split into channels s1, s2, ... sN by the filter group 301b is multiplied in the multiplication block 311 by the channel amplification coefficients b1, b2, ..., bN. The channel attenuation coefficients are calculated in the calculation block 310. The scaled channel signals are assembled in the filter group 312 to the total voice band signal 313 and the sampling frequency is increased to the original.

FIG. 4a shows a basic illustration of the total response of the filter system used for the background noise estimation in the noise attenuation system in accordance with the invention. The figure also pictures a basic spectral representation 400 of a tonal sound and an example of noise which is irregularly distributed in the frequency band. The background noise estimate is obtained according to the previous description by using the two pass-bands 401 located in each channel.

FIG. 4b shows the amplitude response of an ideal noise estimation filter in the noise attenuation system in accordance with the invention. The noise estimation filter is a band-pass filter having a narrow pass-band 404. The noise estimation filter is designed so that the presented common response (in FIG. 4a) of the channel splitting filter group and the noise estimation filter results in, the distance between the outer edges of the two narrow pass-bands 401 on each noise attenuation system channel being than the lowest typical basic frequency of the voice signal. When the lowest basic frequency is considered to be 80 Hz, then according to the designations of FIG. 4b the filter design requirement is $2 \times (BW+D) < 80$ Hz. Between the pass-bands there is left a protection interval having a width of $2 \times D$, which separates the pass-bands, because in practice the spectral components are not ideally peaked, but they are somewhat spread into their neighbourhood. 20 Hz has proved to be a sufficient protection interval width, whereby D=10 Hz and BW=30 Hz. The attenuation required of the noise estimation filter stop-band is of the magnitude 40 dB. Because the channel splitting filter group according to FIG. 3a is realized by optimally decreasing the sampling frequency, the noise estimation filter operates on a sampling frequency fs'=fs (2×N), which is lower than the original. Thus it is easier to realize the narrow pass-band of the noise estimation filter, because it is rather wide compared to the current sampling frequency fs'.

Figure 4C:
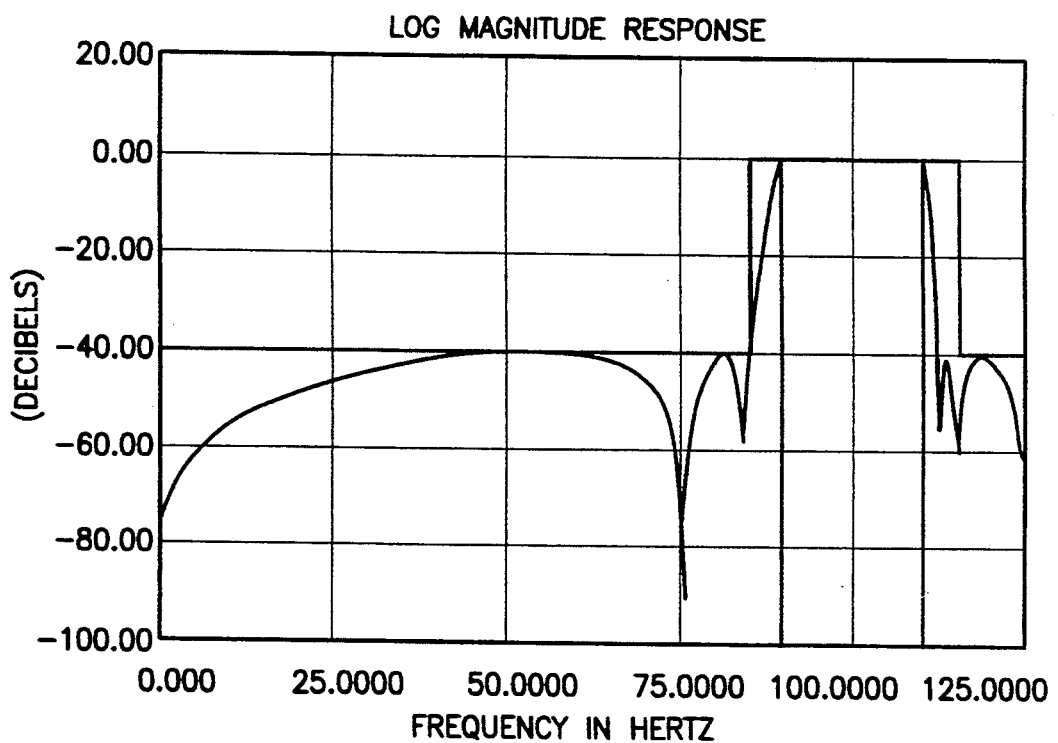
FIG. 4c is the amplitude response of noise estimation filter used in a noise attenuation system in accordance with the invention.

FIG. 4c shows the amplitude response of noise estimation filter used in the noise attenuation system according to the invention (fs=8 kHz, N=16, fs'=250 Hz). This filter is realized as a 10 degrees recursive elliptical filter.

In accordance with the invention a noise attenuation system is obtained, which is easy to realize and able to attenuate the background noise effectively. Because the method measures the background noise already at the voice signal, without the need to wait for pauses in the speech, the method rapidly reacts on changes in the background noise and is particularly well suited for such applications, in which the background noise contains rapid changes. The method neither requires reliable decisions on whether the signal contains voice or only background noise, which are difficult to make and particularly difficult to make on toneless sounds. The method recognizes the periodical nature of tonal sounds, but it does not require measurements of the basic frequency, which are difficult to make. The method is easy to realize e.g. by a digital signal processor. The method can be realized by different circuit solutions. Digital circuit structures are particularly suitable to be used.

Because the noise attenuation system in accordance with the invention estimates the background noise only during speech, it is possible to add to the system noise estimation also during pauses. Detection of pauses and the addition of a background noise estimation according to FIG. 1 does not, however, eliminate the advantages of the presented noise attenuation system, i.e. the continuous noise estimation from the voice and a rapid response to noise characteristics changing during the speech.

In view of the foregoing it will be clear to a person skilled in the art that modifications may be incorporated without departing from the scope of the present invention.

I claim:

1. A noise attenuation system for attenuating noise in a signal, comprising a filter for dividing the signal into a plurality of channels of a predetermined bandwidth, means for calculating the signal strength in each channel and estimating the noise strength in each channel, said system further comprising;

a buffer for processing of the signal sequentially in distinct time periods of a predetermined length, and having an output coupled to a tonality decision block and said filter, said tonality decision block classifying each period as tonal or toneless, a background noise measurement system coupled to said filter and responsive to signals in said plurality of channels, for determining an estimate of background noise strength, said background noise measurement system splitting frequency components of signals from at least one channel into plural frequency ranges during each time period in which a tonal signal is indicated for said channel, and determining from one split frequency range, said background noise strength and a signal to noise ratio for each channel in each time period, a gain calculation block for determining a gain coefficient for each channel in each time period, such that the channel attenuation is increased for a decreasing signal to noise ratio, the gain calculation block coupled to a multiplication block for amplifying the signals in the plurality of channels dependent on the determined gain coefficient, and an assembly filter which reassembles noise attenuated channels to produce a noise attenuated signal.

2. A noise attenuation system according to claim 1, characterized in that the background noise measurement system comprises a splitting filter group for providing a plurality of first narrow passband signals, a background noise estimation block for providing a noise estimate for each first narrow passband signal during a tonal period, and a channel power estimation block for estimating power in each said first narrow passband signal.

3. A noise attenuation system according to claim 2, wherein the background noise estimation block comprises a Quadrature Mirror Filter for providing at least two second narrow passbands;

a noise estimation filter coupled to said Quadrature Mirror Filter;

power calculation blocks coupled to said noise estimation filter for determining signal powers in each of said second narrow passbands; and minimum selection blocks responsive to outputs from said power calculation blocks to determine which second passband exhibits lesser power whereby a coefficient is determined according to the power in the passband that exhibits lesser power.

4. A noise attenuation system according to claim 3, characterized in that the noise estimation filter comprises a band-pass filter with a third narrow pass-band.

5. A noise attenuation system according to claim 3, characterized in that the noise estimation filter comprises a recursive elliptical filter.

6. A noise attenuation system according to claim 1, characterized in that the background noise measurement system includes two narrow passbands, the distance that separated the two narrow passbands being smaller than the lowest typical basic frequency of a voice signal.

7. A method of attenuating noise in a signal comprising, dividing the signal into a plurality of channels of a predetermined bandwidth;

processing the signal sequentially in distinct time periods of a predetermined length;

making an estimate of signal strength in each channel in each time period;

classifying each time period as tonal or toneless;

making an estimate of background noise strength during at least one tonal time period by splitting frequency components of signals from each channel into plural frequency ranges and determining a signal content in one frequency range of each channel, to thereby determine a background noise measurement therefrom and a signal to noise ratio for each channel in each time period;

determining a gain coefficient for each channel in each time period, such that attenuation of the channel is increased for a decreasing signal to noise ratio;

amplifying the signals in the channels dependent on determined gain coefficients; and reassembling the amplified signals in the channels to produce a noise attenuated signal.

8. A method according to claim 7, characterized in that a decision is periodically made on the tonality of the signal contained in each time period.

9. A method according to claim 8, characterized in that the noise signal strength is estimated during periods classified as tonal, so that powers are measured of two narrow partial passbands that are separated by a frequency range that is smaller than the basic frequency on each channel of the noise attenuation system, and a lower partial passband power is defined to represent noise prevailing on the respective channel, whereby the background noise power of each channel is selected by suitably scaling the partial passband power.

10. A noise attenuation system according to claim 7, characterized in that noise estimation is also performed during periods which are not classified as tonal.

* * * * *